(12) United States Patent
Phillips et al.

(10) Patent No.: US 6,927,332 B1
(45) Date of Patent: Aug. 9, 2005

(54) FLEXIBLE TEST CABLE

(75) Inventors: James P. Phillips, Lake in the Hills, IL (US); Kristen M. Leininger, Grayslake, IL (US); Paul J. Moller, Lake Zurich, IL (US)

(73) Assignee: Motorola, Inc., Schaumburg, IL (US)

( * ) Notice: Subject to any disclaimer, the term of this patent is extended or adjusted under 35 U.S.C. 154(b) by 7 days.

(21) Appl. No.: 10/806,019

(22) Filed: Mar. 22, 2004

(51) Int. Cl.$^7$ .................................................. H01B 7/00
(52) U.S. Cl. ......................................... 174/28; 174/111
(58) Field of Search ........................... 174/28, 111, 36, 174/102 R; 324/322; 333/243

(56) References Cited

U.S. PATENT DOCUMENTS

| | | | | |
|---|---|---|---|---|
| 1,911,470 A | * | 5/1933 | Rosner | 464/173 |
| 2,018,353 A | * | 10/1935 | Gothe | 174/28 |
| 2,495,867 A | * | 1/1950 | Peters | 264/619 |
| 2,566,335 A | * | 9/1951 | Joerren | 338/26 |
| 2,587,916 A | * | 3/1952 | Squier | 338/26 |
| 3,105,287 A | * | 10/1963 | Whearley et al. | 29/605 |
| 3,106,599 A | * | 10/1963 | Leitner et al. | 174/12 R |
| 4,029,891 A | * | 6/1977 | Nakata | 174/14 R |
| 4,396,797 A | * | 8/1983 | Sakuragi et al. | 174/68.3 |
| 5,455,548 A | * | 10/1995 | Grandchamp et al. | 333/260 |
| 5,902,957 A | * | 5/1999 | Takahashi et al. | 174/36 |
| 2004/0046557 A1 | | 3/2004 | Karmarkar et al. | |

OTHER PUBLICATIONS

R. Lowe and K. Cawley, Keithley Instruments, Cleveland, Ohio; Optimizing Test Performance of Digital Cellular Products With Ultra–High Speed Power Supplies (White Paper); 2000.

James P. Phillips, Eric L. Krenz, Andrew A. Efanov, Motorola, Inc., Harvard, IL.; Spherical–Scan Near–Field Chamber For Cellular Phones; AMTA '98 Antenna Measurement Techniques Association 20$^{th}$ Annual Meeting and Symposium; Montreal, Quebec, Canada; Oct. 1998, pp. 37–42.

* cited by examiner

Primary Examiner—Chau N. Nguyen
(74) Attorney, Agent, or Firm—Sylvia Chen

(57) ABSTRACT

A flexible test cable has a center conductor (210), a conductive sleeve (240) with an effective electrical length equal to an odd quarter wavelength of a frequency of interest, a dielectric spacer (230) located inside the conductive sleeve (240) for preventing a portion of the center conductor from electrically coupling to the conductive sleeve, and a dielectric joint (220) for maintaining a portion of the center conductor in the middle of an end of the conductive sleeve (240). The conductive sleeve (240) can have a variety of cross-sectional shapes. The dielectric spacer (230) can be formed in a variety of shapes from rigid or compressible dielectric materials. Likewise, the dielectric joint (220) can be formed in a variety of shapes from rigid or compressible dielectric materials. Using the dielectric joint (220) to link together multiple conductive sleeves (240) results in a flexible test cable (200) with electrical transparency at the frequency of interest.

25 Claims, 3 Drawing Sheets

FLEXIBLE TEST CABLE

FIELD OF THE DISCLOSURE

This disclosure relates generally to anechoic electromagnetic field test chambers, and more particularly to cables used in such test chambers for testing electronic devices.

BACKGROUND OF THE DISCLOSURE

Anechoic chambers are used to test radio-frequency (RF) emissions of electronic devices such as radiotelephones, pagers, and cordless telephones. These chambers include a shielded enclosure and absorber material, positioners and mounts for the device under test (DUT), and cabling. Each of these elements must be precision-implemented to produce a high quality anechoic chamber. It is desirable that the elements be re-usable and re-configurable to enable testing of a range of devices in a variety of environments. Occasionally, a human model (sometimes called a "phantom") is added to the environment to approximate the effect of a human being on a DUT's RF emissions.

Much research and development has occurred in the fields of shielding the enclosure, providing high-quality absorber materials, and developing DUT positioners and mounts for use in anechoic chambers. Developments in cabling, however, have been scarce. Thus, there is an opportunity for cabling that is nearly RF invisible (sometimes called "RF transparent") at the RF band of interest. Additionally, there is an opportunity for cabling that is flexible and thus usable in a variety of test configurations.

The various aspects, features and advantages of the disclosure will become more fully apparent to those having ordinary skill in the art upon careful consideration of the following Drawings and accompanying Detailed Description.

DETAILED DESCRIPTION OF THE PREFERRED EMBODIMENTS

A flexible test cable has a center conductor, a conductive sleeve with an effective electrical length equal to an odd quarter wavelength of a frequency of interest, a dielectric spacer located inside the conductive sleeve for preventing a portion of the center conductor from electrically coupling to the conductive sleeve, and a dielectric joint for maintaining a portion of the center conductor in the middle of an end of the conductive sleeve. The conductive sleeve can have a variety of cross-sectional shapes. The dielectric spacer can be formed in a variety of shapes from rigid or compressible dielectric materials. Likewise, the dielectric joint can be formed in a variety of shapes from rigid or compressible dielectric materials. Using the dielectric joint to link together multiple conductive sleeves results in a flexible test cable with electrical transparency at the frequency of interest.

Figure 1:
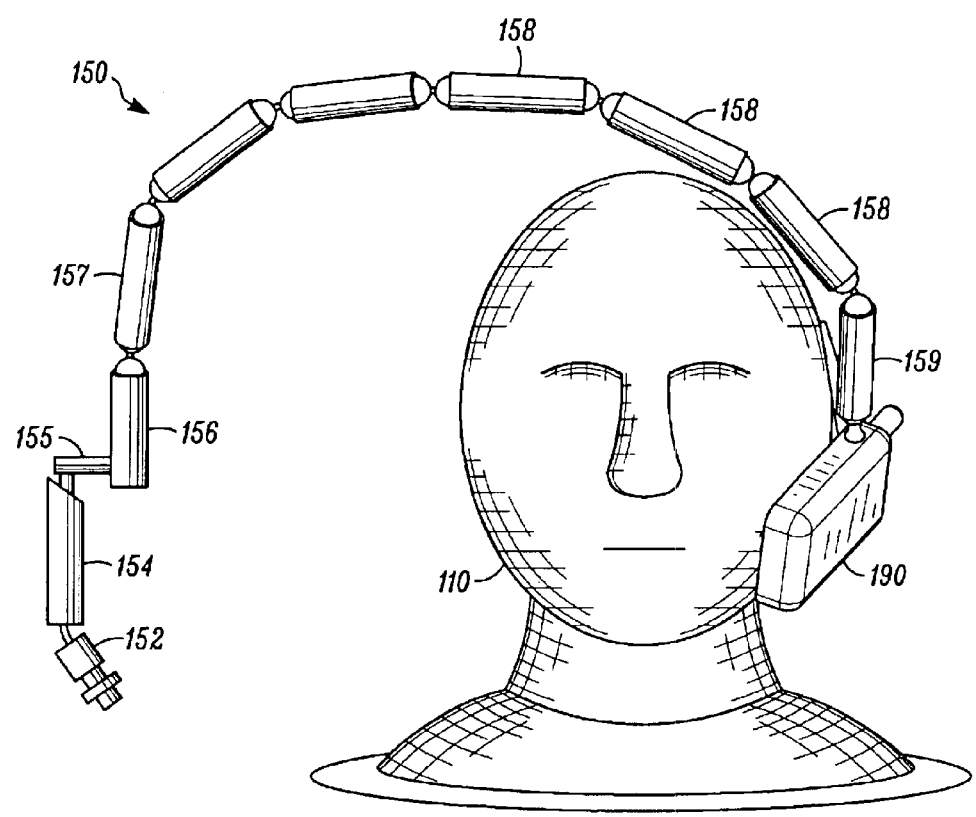
FIG. 1 shows a flexible test cable according to a preferred embodiment in a radio-frequency (RF) testing environment.

FIG. 1 shows a flexible test cable 150 according to a preferred embodiment in a radio-frequency (RF) testing environment 100. The RF testing environment 100 includes a phantom head 110 and a device under test (DUT) 190 mounted near an ear portion of the phantom head 110. Although not shown, the enclosure of the environment is shielded, and pyramidal absorber material is placed on all inner surfaces of the enclosure in accordance with general RF testing procedures. The flexible test cable 150 provides power, control, or other test signals to the DUT 190 during testing. Because the test cables for this RF testing environment 100 must go from a test engineer bench, which is usually outside of the anechoic chamber, to the DUT 190, which is generally toward the center of the anechoic chamber, there is no place to electrically hide these test cables when measuring the RF radiation pattern of an omni-directional antenna. Such omni-directional antennas are common for radiotelephones, thus the DUT 190 is shown as a radiotelephone. Of course, the flexible test cable 150 can be used for other types of DUTs and other types of antennas.

The flexible test cable 150 includes at least one rigid cable segment 158. The rigid cable segments 158 have an effective electrical length of odd quarter wavelengths (¼ λ, ¾ λ, etc.) of the frequency of interest. In order to provide the most flexibility, the rigid cable segments 158 shown are ¼ λ; however, other odd quarter wavelengths provide similar RF invisibility and may be used as appropriate depending on factors such as the desire for cable flexibility, the desire for cable strength, the test environment, and the frequency of interest.

A final rigid cable segment 159 at the end of the flexible test cable 150 couples to the DUT 190 chassis at a point of low electromagnetic fields. At the other end of the flexible test cable 150, an initial rigid cable segment 157 is coupled to a sleeve 156 with an integral right-angle connector. A connector pair 155 couples the sleeve 156 to another sleeve 154 on a rigid test cable. Another connector 152 allows for electrical connection of the flexible test cable 150 to another cable, such as another rigid test cable. Different connector configurations can be substituted for the ones shown here in order to accommodate other testing environments.

This flexible test cable 150 addresses a number of issues. First, the various connectors 152, 155 and sleeves 154, 156 at the beginning of the flexible test cable 150 provide strength and stability to the flexible test cable 150 such that the cable 150 can couple to the DUT 190 without overly taxing the DUT mount (not shown). Next, the test cable 150 is flexible enough to be applied to a variety of DUT types in a variety of testing environments. Previously, different DUTs usually needed different test cables due to the different DUT sizes—even when the different DUTs all had the same frequency of interest. Also previously, even with the same DUT, sometimes different cables were needed for different testing configurations. Finally, the flexible test cable 150 is nearly RF invisible at the frequency of interest because the rigid cable segments 158 have an effective electrical length of odd quarter wavelengths. Thus, each rigid cable segment 158 has a high impedance end that provides decoupling of the flexible test cable 150 from the DUT 190.

Figure 2:
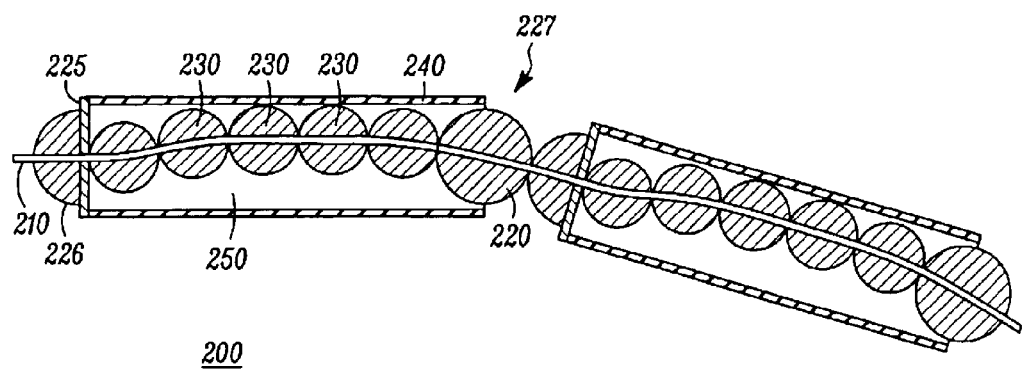
FIG. 2 shows rigid cable segments of the flexible test cable shown in FIG. 1 according to a first embodiment.

FIG. 2 shows rigid cable segments 200 of the flexible test cable 180 shown in FIG. 1 according to a first embodiment. In this first embodiment, a center conductor 210 is surrounded by spherical dielectric spacers 230 that provide appropriate spacing of the center conductor 210 from an odd quarter wavelength choke sleeve 240.

The center conductor 210 can be either a single wire or multiple wires, depending on the implementation of the flexible test cable 150 shown in FIG. 1. A common implementation of the flexible test cable 150 would be for a coaxial cable. Alternately, the center conductor 210 may include a braid of wires that enclose and shield a single wire or group of wires. The center conductor 210 passes through an odd quarter wavelength choke sleeve 240.

The sleeve 240 is constructed of a conductive material and has a bushing 225 on one end to electrically couple the center conductor 210 to the sleeve 240. The other end 227 of the sleeve 240 is open. Because the sleeve 240 is an odd quarter wavelength, the open end 227 has high impedance, which allows for decoupling of the RF signals in the flexible test cable 150 from the DUT 190 shown in FIG. 1. In this first embodiment, the sleeve is cylindrical in shape with a circular cross-section. Alternate shapes, however, are available such as a sleeve with a square cross-section, an oval cross-section, or a hexagonal cross-section.

Inside the sleeve 240, one or more dielectric spacers 230 surround a length of the center conductor 210. In this first embodiment, the dielectric spacers 230 are configured as spheres with a diameter smaller than the diameter of the sleeve 240, and an air gap 250 results between at least a portion of the dielectric spacers 230 and the inner surface of the sleeve 240. The center conductor 210 passes through a diameter of each sphere and is protected both electrically and physically by the dielectric spacer 230. The dielectric sphere construction allows a portion of the center conductor 210 to bend and flex inside the sleeve 240 without electrically coupling to the sleeve 240 and without significantly straining the conductor 210. Although the dielectric spacers 230 are shown continuously enclosing the center conductor 210, such continuous enclosure is not necessary for all applications. In other words, there may be gaps between consecutive dielectric spacers 230. Alternate configurations for the dielectric spacers 230 include ovoid and disk. The dielectric spacers can be constructed from a rigid dielectric material or a soft, compressible dielectric material such as open cell foam.

A dielectric joint 220 is located near the open end 227 of the sleeve 240 to maintain the position of the center conductor 210 in the middle of the open end 227 of the choke sleeve 240. The dielectric joint 220 shown is spherical in shape, which permits a large range of movement of the rigid cable segments 158 relative to each other (shown in FIG. 1) without allowing too much strain on the center conductor 210. Alternate shapes for the dielectric joints 220 include hemispherical, ovoid, and disk shapes constructed from rigid or compressible dielectric materials. The dielectric joint on the final rigid cable segment 159 (shown in FIG. 1) can be custom-designed to conform to the electrical connection to the DUT 190 (shown in FIG. 1).

For further strength, a hemispherical dielectric cover 226 is included on the bushing 225. Other cover 226 configurations are available, including ovoid and square shapes formed from rigid or compressible dielectric materials. Omitting the cover 226 is also a possibility with a potential lessening of flexibility or strength between rigid cable segments.

The combination of spherical dielectric spacers 230 and spherical dielectric joints 220 provides flexibility to the entire test cable 150 (shown in FIG. 1) as well as strength. Depending on the testing environment, the flexible test cable 150 (shown in FIG. 1) can be positioned over, around, or under DUT mounts, positioners, phantoms, and other elements of the testing environment. Additionally, the flexibility and strength of the test cable 150 allows reuse of the test cable for a number of DUTs in a number of testing environments.

Figure 3:
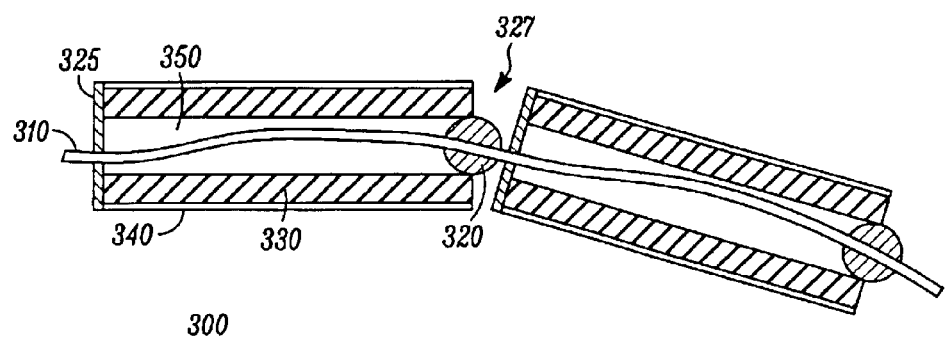
FIG. 3 shows rigid cable segments of the flexible test cable shown in FIG. 1 according to a second embodiment.

FIG. 3 shows rigid cable segments 300 of the flexible test cable 180 shown in FIG. 1 according to a second embodiment. In this second embodiment, a center conductor 310 is surrounded by a dielectric spacer 330 fashioned as a solid dielectric tube that is located inside an odd quarter wavelength choke sleeve 340. In this second embodiment, the sleeve is cylindrical in shape with a circular cross-section. Alternate shapes, however, are available such as a sleeve with a square cross-section, an oval cross-section, or a hexagonal cross-section.

The center conductor 310 can be either a single wire or multiple wires, depending on the implementation of the flexible test cable 150 shown in FIG. 1. A common implementation of the flexible test cable 150 would be for a coaxial cable. Alternately, the center conductor 310 may include a braid of wires that enclose and shield a single wire or group of wires. The center conductor 310 passes through an odd quarter wavelength choke sleeve 340.

The sleeve 340 is constructed of a conductive material and has a bushing 325 on one end to electrically couple the center conductor 310 to the sleeve 340. The other end 327 of the sleeve 340 is open. Because the sleeve 340 is an odd quarter wavelength, the open end 327 has high impedance, which allows for decoupling of the RF signals in the flexible test cable 150 from the DUT 190 shown in FIG. 1.

Inside the sleeve 340, one or more dielectric spacers 330 surround a length of the center conductor 310. The center conductor 310 is loosely positioned along a longitudinal axis of the dielectric spacer 330. In this second embodiment, a single dielectric spacer 330 is configured as a solid dielectric tube with an outer circumference that contacts the inner surface of the sleeve 340 and an inner diameter greater than the diameter of the center conductor 310. Thus, an air gap 350 results between at least a portion of the dielectric spacer 330 and the center conductor 310. The dielectric tube construction with tubular air gap allows a portion of the center conductor 310 to bend and flex inside the sleeve 340 without electrically coupling to the sleeve 340 and without significantly straining the conductor 310. Although the dielectric spacers 330 are shown continuously enclosing the center conductor 310 within a sleeve 340, such continuous enclosure is not necessary for all applications. In other words, the dielectric spacer 330 can be constructed from one tube having the length of the sleeve 340 or several contiguous (but not necessarily touching) tubes. The dielectric spacer 330 can be constructed from rigid dielectric material or soft, compressible dielectric material such as open cell foam.

A dielectric joint 320 is located near the open end 327 of the sleeve 340 to maintain the position of the center conductor 310 in the middle of the open end 327 of the choke sleeve 340. The dielectric joint 320 shown is spherical in shape, which permits a large range of movement of the rigid cable segments 158 relative to each other (shown in FIG. 1) without allowing too much strain on the center conductor 310. Alternate shapes for the dielectric joints 320 include hemispherical, ovoid, and disk constructed from rigid or compressible dielectric materials. The dielectric joint on the final rigid cable segment 159 (shown in FIG. 1) can be custom-designed to conform to the electrical connection to the DUT 190 (shown in FIG. 1).

Note that there is no dielectric cover on the bushing 325 shown in this second embodiment. The result is a risk of increasing strain on the center conductor 310. Depending on the application of the flexible test cable, this risk may be acceptable.

Figure 4:
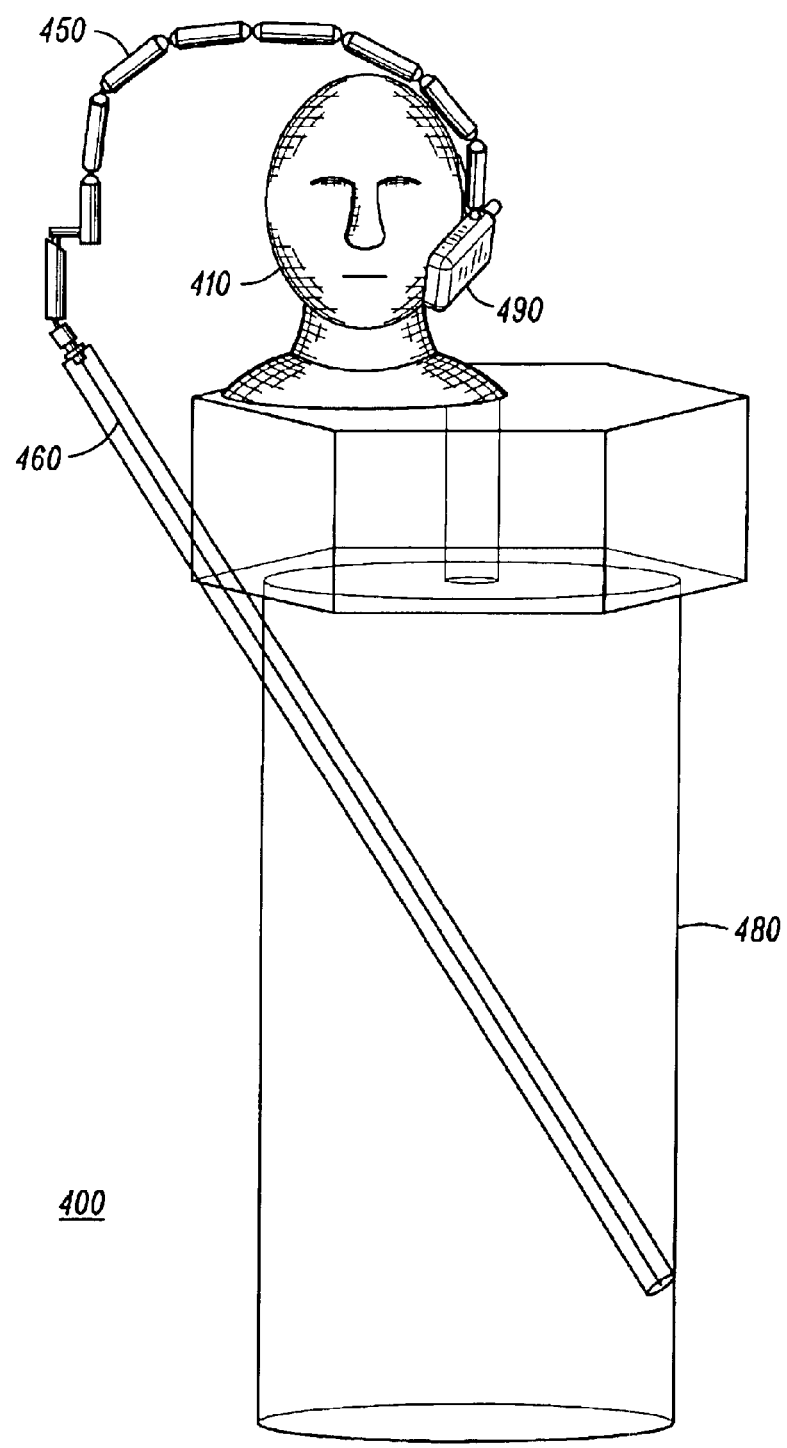
FIG. 4 shows a flexible test cable according to the preferred embodiment in another radio-frequency (RF) testing environment.

FIG. 4 shows a flexible test cable 450 according to the preferred embodiment in another radio-frequency (RF) testing environment 400. This RF testing environment 400 includes a phantom head 410 mounted on a support 480 and a device under test (DUT) 490 mounted near an ear portion of the phantom head 410. Because the DUT 490 is mounted on a support 480, a rigid test cable 460 is used in combination with a flexible test cable 450 to bring power, control, or any other test signals to the DUT 490 during testing. Although not shown, the enclosure of the environment is shielded, and pyramidal absorber material is placed on all inner surfaces of the enclosure in accordance with general RF testing procedures. Because the test cables for this RF testing environment 400 must go from a test engineer bench, which is usually outside of the anechoic chamber, to the DUT 490, which is generally toward the center of the anechoic chamber, there is no place to electrically hide these test cables when measuring the RF radiation pattern of an omni-directional antenna. Such omni-directional antennas are common for radiotelephones, thus the DUT 490 is shown as a radiotelephone. Of course, the flexible test cable 450 can be used for other types of DUTs and other types of antennas.

The rigid test cable 460 is an odd quarter wavelength (¼ λ, ¾ λ, etc.) of the frequency of interest to provide decoupling of the rigid test cable 460 from the flexible test cable 450. Thus, the combination of a rigid test cable 460 (which is easier and less costly to manufacture) with a flexible test cable 450 provides cabling that is nearly invisible at a frequency of interest in a variety of testing environments.

As different phantoms are developed, as different supports are used, and as the DUTs change, the flexible test cable is re-usable for a number of different test environments. By combining a flexible test cable with a rigid test cable, further testing environments are available at a reasonable cost.

Of course, odd quarter wavelengths are longer and shorter for different frequencies of interest; however, a single flexible test cable can provide power, control, or other test signals in a variety of testing environments at that frequency of interest. The various dielectric spacers, air gaps, and dielectric joints allow manipulation of the flexible test cable with acceptable strain on the center conductor. The conductive sleeves, dielectric spacers, and dielectric joints also maintain the electrical choke configuration of the rigid cable segments of the flexible test cable during and after manipulation of the flexible test cable.

While this disclosure includes what are considered presently to be the preferred embodiments and best modes of the invention described in a manner that establishes possession thereof by the inventors and that enables those of ordinary skill in the art to make and use the invention, it will be understood and appreciated that there are many equivalents to the preferred embodiments disclosed herein and that modifications and variations may be made without departing from the scope and spirit of the invention, which are to be limited not by the preferred embodiments but by the appended claims, including any amendments made during the pendency of this application and all equivalents of those claims as issued.

It is further understood that the use of relational terms such as first and second, top and bottom, and the like, if any, are used solely to distinguish one from another entity, item, or action without necessarily requiring or implying any actual such relationship or order between such entities, items or actions.

We claim:

1. A cable comprising:

a center conductor;

a conductive sleeve having a first end and a second end and an effective electrical length equal to an odd quarter wavelength of a frequency of interest, surrounding a portion of the center conductor, with the first end physically and electrically coupled to the center conductor;

a dielectric spacer, located inside the conductive sleeve, for preventing another portion of the center conductor from physically and electrically coupling to the conductive sleeve; and a dielectric joint, coupled to the second end of the conductive sleeve, for positioning a portion of the center conductor in a middle of the second end.

2. A cable according to claim 1 wherein the center conductor includes a single wire.

3. A cable according to claim 1 wherein the center conductor includes multiple wires.

4. A cable according to claim 1 wherein the dielectric spacer is constructed from a rigid dielectric material.

5. A cable according to claim 1 wherein the dielectric spacer is constructed from a compressible dielectric material.

6. A cable according to claim 1 wherein the dielectric spacer comprises a spherical dielectric element.

7. A cable according to claim 6 wherein a diameter of the spherical dielectric element is shorter than a diameter of the conductive sleeve.

8. A cable according to claim 6 wherein the center conductor is located inside the dielectric spacer along a diameter of the dielectric spacer.

9. A cable according to claim 6 wherein the dielectric spacer comprises multiple spherical dielectric elements.

10. A cable according to claim 1 wherein the dielectric spacer comprises a tubular solid dielectric element with an outer diameter and an inner diameter.

11. A cable according to claim 10 wherein the center conductor is located inside the dielectric spacer along a longitudinal axis of the tubular solid dielectric element.

12. A cable according to claim 10 wherein the outer diameter of the tubular solid dielectric element is approximately a diameter of the conductive sleeve and the inner diameter of the tubular solid dielectric element is larger than a diameter of the center conductor.

13. A cable according to claim 10 wherein the dielectric spacer comprises a tubular air dielectric element inside the tubular solid dielectric element.

14. A cable according to claim 1 wherein the dielectric joint comprises a spherical dielectric element.

15. A cable according to claim 14 wherein a diameter of the spherical dielectric element is approximately equal to a diameter of the conductive sleeve.

16. A cable according to claim 14 wherein the center conductor is located inside the dielectric joint along a diameter of the dielectric joint.

17. A cable according to claim 1 wherein the first end comprises a conductive bushing.

18. A cable according to claim 17 wherein the first end further comprises a hemispherical dielectric cover.

19. A cable according to claim 1 wherein the conductive sleeve is cylindrical in shape.

20. A cable according to claim 1 wherein the dielectric joint is constructed from a rigid dielectric material.

21. A cable according to claim 1 wherein the dielectric joint is constructed from a compressible dielectric material.

22. A cable comprising:
   a first rigid segment having an effective electrical length equal to an odd quarter wavelength of a frequency of interest;
   a flexible joint, coupled to one end of the first rigid segment;
   a second rigid segment having an effective electrical length equal to an odd quarter wavelength of the frequency of interest, coupled to the flexible joint; and
   a linear conductor, located within the first rigid segment, the flexible joint, and the second rigid segment.

23. A cable according to claim 22 further comprising:
   a first dielectric spacer, located inside the first rigid segment; and
   a second dielectric spacer, located inside the second rigid segment.

24. A cable according to claim 22 further wherein the first rigid segment comprises a conductive sleeve with one end electrically coupled to the linear conductor.

25. A cable according to claim 24 wherein the flexible joint comprises a dielectric element that maintains a portion of the linear conductor in a middle of the conductive sleeve.

* * * * *